United States Patent [19]

Friesen et al.

[11] Patent Number: 4,945,071
[45] Date of Patent: Jul. 31, 1990

[54] LOW SOFTENING POINT METALLIC OXIDE GLASSES SUITABLE FOR USE IN ELECTRONIC APPLICATIONS

[75] Inventors: G. Delbert Friesen, Hunt. Beach; Yun K. Shin, Glendale, both of Calif.; Lewis Hoffman, deceased, late of Riviera Beach, Fla., by Norma Hoffman, Executrix

[73] Assignee: National Starch and Chemical Investment Holding Company, Wilmington, Del.

[21] Appl. No.: 340,183

[22] Filed: Apr. 19, 1989

[51] Int. Cl.$^5$ ............................................... C03C 3/12
[52] U.S. Cl. .................................... 501/41; 501/73; 501/74; 106/1.14; 106/1.19
[58] Field of Search .................. 501/41, 73, 74; 106/1.14, 1.19

[56] References Cited

U.S. PATENT DOCUMENTS

| 3,853,568 | 12/1974 | Chvatal | 501/46 |
| 4,401,767 | 8/1983 | Dietz et al. | 501/19 |
| 4,459,166 | 7/1984 | Dietz et al. | 106/1.14 |
| 4,743,302 | 5/1988 | Dumesnil et al. | 106/1.23 |
| 4,743,362 | 5/1988 | Dumesnil et al. | 501/41 |

OTHER PUBLICATIONS

*Johnson Matthey Trade Literature,* "JM 4720* AUSUB ® Die Attach Material".
*Johnson Matthey Processing Guidelines,* "JM 4613 and JM 4720 AUSUB Die Attach Paste".
*Johnson Matthey Technical Service Bulletin,* "JMI 4720 Peak Firing Temperatures", (Nov. 8, 1985).
*QMI Technical Bulletin,* "Processing Information for QMI 2412 Ag/Glass Die Attach Paste".

*Primary Examiner*—William R. Dixon, Jr.
*Assistant Examiner*—Melissa Bonner
*Attorney, Agent, or Firm*—Royal N. Ronning, Jr.; Edwin M. Szala

[57] ABSTRACT

This invention presents a series of glasses which possess low softening points, high resistance to recrystallization and good durability in the presence of moisture. The glasses are contained within oxides of silver, vanadium, tellurium, and lead and have glass transition temperatures below 260° C., and are useful in electronic applications such as die attach adhesives and sealing glasses.

13 Claims, No Drawings

LOW SOFTENING POINT METALLIC OXIDE GLASSES SUITABLE FOR USE IN ELECTRONIC APPLICATIONS

BACKGROUND OF INVENTION

Low softening point glasses are particularly useful in silver filled (or silver glass) die attach adhesives. Such adhesives, are used to attach semiconductor chips (dies) to substrates and are typically applied by heating the system beyond the softening point of the glass. The bond forms during cooling.

Because many semiconductor devices, such as silicon integrated circuits or gold sputtered devices are temperature sensitive, it is desirable to keep the peak temperature experienced by the system to a minimum. Accordingly, a number of low softening point glasses have been investigated and a series of adhesives based on "lead/-borates" ($PbO/B_2O_3/SiO_2$ or $PbO/B_2O_3/Bi_2O_3$) have been utilized. These adhesives have softening points in the region of 375° C. and glass transition temperatures ($T_g$) in the region of 325° C., and are ordinarily processed as silver glass die attach adhesives at 425°–450° C. (approximately 100°–125° C. above the respective glass transition temperatures)

While glass systems with lower softening points are known, most are not useful in die attach adhesives due to low crystallization temperatures and poor moisture resistance; further, these glasses often contain compounds such as alkali metals and fluorides, which can be detrimental to semiconductor devices, thus limiting their utility in electronic applications. For an adhesive to function, the glass must readily reform upon cooling; recrystallization generally weakens the ultimate bond strength. Thus, glasses useful in die attach adhesives must, in addition to having a low softening point, be resistant to recrystallization in the operating temperature range. Since glasses with lower softening points tend to crystallize at lower temperatures, this is a unique combination of properties.

Accordingly, it is an object of this invention to present a series of glasses suitable for use in die attach adhesives which combine the properties of a low softening point with a high resistance to recrystallization, good moisture resistance, and the absence of compounds detrimental to semi-conductor devices.

SUMMARY OF INVENTION

The above and related objects are achieved by the four component glass compositions of this invention. These glasses are characterized by low softening points (325° C. or less), low glass transition temperatures (less than 260° C.), a marked resistance to recrystallization, and good durability in the presence of moisture, even after being ground to a fine powder. They are also free of alkali metals and fluorides which can deleteriously affect the performance of electronic components, permitting their use in electronic applications.

The glasses comprise mixtures of 2 to 40% silver oxide ($Ag_2O$), 12 to 40% vanadium oxide ($V_2O_5$), 35 to 75% tellurium oxide ($TeO_2$), and 2–30% PbO, wherein all percentages are by weight and total 100.

The glasses can also contain minor (up to a total of 10% by weight, the precise amount of each compound will, of course, be governed by the dsesired final properties as well as its solubility in the glass composition) of one or more of the following oxide compounds; phosphorous oxide ($P_2O_5$), aluminum oxide ($Al_2O_3$), bismuth oxide ($Bi_2O_3$), tin oxide ($SnO_2$), zinc oxide (ZnO), titanium oxide ($TiO_2$), molybdenum oxide ($MoO_3$), tungsten oxide ($WO_3$), silicon oxide ($SiO_2$), copper oxide (CuO), thallium oxide ($Tl_2O$) arsenic oxide ($As_2O_3$), and antimony oxide ($Sb_2O_3$). Inclusion of these compounds will cause slight variations in the softening and glass transition temperatures of the glasses and, thus, can be used to customize the composition for a particular application while maintaining the desirable properties of the glass.

The above glasses can be utilized as metallic glass die attach adhesives, useful in attaching semiconductor components to substrates. Briefly, powdered, flaked, or mixtures of powdered and/or flaked metallic silver, gold, or platinum (preferably silver) is admixed with the powdered glass in a ratio of 4:1 to 100:1, preferably 5:1 to 25:1. This results in a die attach adhesive which can be fired at a very low temperature (generally 400° C. or less) yet result in a strong bond, suitable for use in many applications. Die attach adhesives are described in detail in U.S. Pat. No. 4,401,767 to Dietz et al., which is incorporated herein by reference.

These glasses can also be used in other applications such as sealing glasses or cermets, which require stable, low softening temperature glasses. The sealing glass application is of particular interest, as the glasses possess thermal expansion coefficients in the same range as glasses ordinarily used in such applications. Thus, these glasses can be used without filler in applications requiring thermal expansion coefficients in the range of 14–20, or, if lower thermal expansion coefficients are desired, these glasses can be combined with expansion-modifying fillers, such as amorphous silica or beta-eucryptite. Such fillers have low thermal expansion coefficients and will result in composites having thermal expansion coefficients lower than the glasses, the coefficient decreasing as the filler content increases (as described in U.S. Pat. No. 3,837,866 to Malmeindier et al. incorporated, herein by reference). Thus, low softening point sealing glasses can be easily obtained.

DETAILED DESCRIPTION OF INVENTION

The glasses of this invention comprise four metallic oxides namely $Ag_2O$, $V_2O_5$, $TeO_2$, and PbO. These components are present in the compositions as follows:

| Compound | Range (wt %) |
| --- | --- |
| $Ag_2O$ | 2–40 |
| $V_2O_5$ | 12–40 |
| $TeO_2$ | 35–75 |
| PbO | 2–30 | wherein all percentages total 100.

Preferably, the $Ag_2O/TeO_2$ ratio (wt/wt) ranges from 0.1/1 to 0.5/1, (but can range as high as 0.8/1 when the $V_2O_5/TeO_2$ ratio is about 0.28/1). Glasses of these compositions are characterized by low $T_g$'s (below 260° C.) and, thus low softening points (325° C. or less), since the softening point is generally no more than 50°–70° C. greater than $T_g$. They also exhibit marked resistance to recrystallization, even when ground to a fine powder.

It is this resistance to recrystallization and good durability toward moisture that distinguishes the glasses of this invention from heretofore known low softening metal oxide glasses. While not wishing to be bound by theory, it is noted that this resistance to recrystallization and durability toward moisture is closely related to the presence of PbO in the system; substitution of other metallic oxides for PbO does not confer these properties without increasing the $T_g$. It is believed that the PbO interacts with the other oxides in the system, making the glass form more stable.

These glasses can also contain minor (up to a total of 10%) amounts of one or more other oxide compositions found in commercial glasses. These compositions include $P_2O_5$, (preferably 0–6%), $SiO_2$, (preferably 0–2%, more preferably 0–1%), CuO (preferably 0–7%, more preferably 0–5%), $Al_2O_3$, $Bi_2O_3$, $SnO_2$, ZnO, $Tl_2O$ (preferably 0–5%, more preferably 0–2%), $As_2O_3$, and $Sb_2O_3$. The precise amount of each compound in the glass formulation will, of course, depend on its solubility in the glass composition. Such compositions will have only a minor effect on the properties of the glasses, and can be used if the presence of these compositions is desirable.

These glasses can also be used as a component in metallic glass die attach adhesives. Such adhesives are particularly useful in the attachment of semiconductor components to substrates. In ordinary use, the adhesive is placed between semiconductor components and the system is heated (fired) to a temperature above the softening point of the glass; the bond forms as the adhesive cools.

The die attach adhesives of this invention are an admixture of flaked and/or powdered metallic silver, gold, or platinum and the four component ($Ag_2O$/$V_2O_5$/$TeO_2$/PbO) glass in a ratio of 4:1 to 100:1, preferably 5:1 to 25:1, along with a high boiling point organic solvent and a polymeric binder; the preferred metal for use is silver. Such adhesives, because of the low softening point of the glasses, require a lower firing temperature to achieve a good bond than conventional die attach adhesives. Generally, the firing temperature is below 400° C., preferably 375° C. or lower. Because of this semiconductor components which are sensitive to temperatures in excess of 400° C., can be attached to substrates by these adhesives.

EXAMPLES

The following examples illustrate certain preferred embodiments of this invention but are not intended to be illustrative of all embodiments.

Example 1 Preparation of Glasses

A total of twenty-eight (28) glasses were prepared by blending and heating $TeO_2$, $V_2O_5$, and $Ag_2CO_3$ and PbO (as needed) to 650° C., (or greater) then quenched on a metal plate to ambient temperature. In these preparations the $Ag_2O$ was added as $Ag_2CO_3$ which decomposes to $Ag_2O$ at elevated temperature. It is recognized that other compounds can be utilized to similarly obtain the metal oxides. The compositions (calculated as weight % of metal oxides) are summarized in Table I.

TABLE I

Summary of Glass Compositions Prepared Amount (wt %)

| Sample | TeO₂ | V₂O₅ | Ag₂O | PbO |
|---|---|---|---|---|
| 1 | 58.4 | 41.6 | 0 | 0 |
| 2 | 54.0 | 38.5 | 0 | 7.5 |
| 3 | 48.2 | 34.3 | 17.5 | 0 |
| 4 | 45.1 | 32.2 | 16.4 | 6.3 |
| 5 | 63.7 | 36.3 | 0 | 0 |

TABLE I-continued

Summary of Glass Compositions Prepared Amount (wt %)

| Sample | TeO₂ | V₂O₅ | Ag₂O | PbO |
|---|---|---|---|---|
| 6 | 62.0 | 35.4 | 0 | 2.6 |
| 7 | 51.7 | 29.5 | 18.8 | 0 |
| 8 | 50.6 | 28.9 | 18.4 | 2.1 |
| 9 | 48.5 | 27.5 | 17.5 | 6.7 |
| 10 | 38.0 | 21.6 | 13.8 | 26.6 |
| 11 | 47.3 | 26.9 | 25.8 | 0 |
| 12 | 44.4 | 25.3 | 24.2 | 6.2 |
| 13 | 27.1 | 15.4 | 19.7 | 7.9 |
| 14 | 59.9 | 32.3 | 5.9 | 2.0 |
| 15 | 47.4 | 20.2 | 25.8 | 6.6 |
| 16 | 77.8 | 22.2 | 0 | 0 |
| 17 | 70.2 | 20.0 | 0 | 9.8 |
| 18 | 60.7 | 17.3 | 22.0 | 0 |
| 19 | 55.9 | 15.9 | 20.3 | 7.8 |
| 20 | 54.7 | 15.6 | 29.8 | 0 |
| 21 | 50.8 | 14.5 | 27.7 | 7.1 |
| 22 | 46.5 | 13.2 | 33.8 | 6.5 |
| 23 | 45.6 | 13.0 | 41.4 | 0 |
| 24 | 42.9 | 12.2 | 38.9 | 6.0 |
| 25 | 78.0 | 11.1 | 0 | 10.9 |
| 26 | 60.8 | 8.7 | 22.1 | 8.5 |
| 27 | 59.3 | 8.4 | 32.3 | 0 |
| 28 | 54.7 | 7.8 | 29.8 | 7.7 |

These samples were retained for use in later experiments.

Example 2 Calorimetric Studies

Powdered samples of each of the glasses prepared in Example I were subjected to thermal analysis on a differential scanning calorimeter(DSC) heating at a rate of 10° C./min. to a peak temperature of 450° C. The glass transition temperature ($T_g$) and crystallization temperature ($T_{cryst}$), if any, were noted. The results are presented in Table II.

TABLE II

Summary of DSC Testing

| Sample | $T_g$(°C.) | $T_{cryst}$ (°C.) |
|---|---|---|
| 1 | 251 | 409 |
| 2 | 258 | 424 |
| 3 | 235 | 347 |
| 4 | 236 | NC* |
| 5 | 261 | NC |
| 6 | 260 | NC |
| 7 | 237 | NC |
| 8 | 236 | NC |
| 9 | 236 | NC |
| 10 | 231 | NC |
| 11 | 223 | 329 |
| 12 | 220 | 334 |
| 13 | NO GLASS | |
| 14 | 256 | NC |
| 15 | 216 | 354 |
| 16 | 275 | 436 |
| 17 | 260 | NC |
| 18 | 236 | 383 |
| 19 | 232 | NC |
| 20 | 217 | 352 |
| 21 | 212 | NC |
| 22 | 193 | NC |
| 23 | 183 | 327 |
| 24 | 182 | 280 |
| 25 | NO GLASS | |
| 26 | 227 | 353 |
| 27 | 209 | 331 |
| 28 | 205 | 310 |

*NC = no crystallization observed to 450° C.

The results reveal that the glass compositions of this invention posses low $T_g$'s and that these compositions (which contain PbO) have lower $T_g$'s and are more resistant to recrystallization than the equivalent compositions without PbO. Further, the only glasses formed without PbO which did not exhibit crystallization in the DSC were observed when the $V_2O_5/TeO_2$ ratio (wt/wt) was approximately 0.57/1. This, the PbO greatly expands the crystallization resistant glass region.

To assess the stabilization effect of oxides other than PbO in the glasses of this invention, a series of compositions based on glass formulation 19 were prepared. The amount of metal oxide added was 0.1 cation per cation of $Te^{4+}$, thus the weight of added metal oxide in the glasses varied. The glasses were examined for $T_g$ and $T_{cryst}$ by DSC. The results are presented in Table III.

TABLE III

Results of Oxide Testing

| Ex. No. | Composition (wt %) | | | | $T_g$ (°C.) | $T_{cryst}$ (°C.) | Remarks |
|---|---|---|---|---|---|---|---|
| | $TeO_2$ | $V_2O_5$ | $Ag_2O$ | Other Oxide | | | |
| 1 | 60.7 | 17.3 | 22.0 | none | 236 | 383 | — |
| 2 | 55.9 | 15.9 | 20.3 | 7.8 PbO | 232 | none | — |
| 3 | 59.5 | 17.0 | 21.6 | 1.9 $Al_2O_3$ | 253 | none | — |
| 4 | 55.9 | 15.9 | 20.3 | 7.8 $Bi_2O_3$ | 241 | none | — |
| 5 | 58.9 | 16.8 | 21.4 | 2.9 CuO | 246 | none | — |
| 6 | 57.4 | 16.4 | 20.8 | 5.4 $SnO_2$ | 235 | 405 | — |
| 7 | 58.9 | 16.8 | 21.3 | 3.0 ZnO | 241 | none | — |
| 8 | 58.9 | 16.8 | 21.4 | 2.9 $TiO_2$ | 240 | 385 | see note 1 |
| 9 | 59.3 | 16.9 | 21.5 | 2.2 $SiO_2$ | 238 | 396 | see note 1 |
| 10 | 57.5 | 16.4 | 20.9 | 5.2 $MoO_3$ | 248 | none | — |

Notes
1 Added oxide did not completely melt to form glass.

As shown, it can be seen that PbO is the only oxide which melts completely to form a glass while reducing or maintaining the low $T_g$ and reducing the tendency to crystallize ($T_{cryst}$).

Example 4 Durability of Glasses in Water

To assess the durability of the glasses to this invention in water, several glasses of Example I were formed into 1.5–2 mm diameter beads. Weighed glass beads were placed in a sealed container containing 15 ml of deionized water and maintained at 100° C. for 1 hour. After removal from the water, the beads were dried, then subsequently reweighed and visually inspected. For comparison, a lead borate glass was also examined. The results are summarized in Table IV.

TABLE IV

Results of Water Durability Testing

| Sample | Weight Change (gm/cm² surface area) | Appearance |
|---|---|---|
| 3 | +0.003 | yellowed |
| 7 | −0.004 | yellowed |
| 9 | no change (<0.001) | no change |
| 18 | −0.001 | slight haze |
| 19 | no change (<0.001) | no change |
| 16 | +0.003 | whitened |
| lead borate glass | 0.05 | white crust on surface |

As shown, it can h=seen that the samples containing PbO were quite durable, exhibiting no changes (in weight or appearance), while the glasses without PbO exhibited significant weight changes and alterations in appearance. The lead borate glass exhibited weight changes more than 50 times greater than the glasses of this invention (Samples 9 and 19).

Example 5 Use of glasses in Die Attach Adhesives

To assess the utility to the glasses of this invention, a sample of adhesive was made by admixing 1 part of glass Sample 14 with 7 parts of metallic silver, a high boiling organic solvent, and a polymeric binder. This was then used to attach a 0.4"×0.4" bare silicon die to a bare 92% alumina substrate by applying the adhesive to the substrate and placing the die on its surface, drying the system at 80° C. for 1 hour, heating to peak temperature at a rate of 30° C./min. and maintaining at peak temperature for 10 min., followed by a cooling at 100° C./min. to ambient temperature.

The strength of the bond was then assessed on a Sebastian III tensile test analyzer, and the mode of failure was recorded. This was compared with the performance of JM4720 (a die attach adhesive marketed by Johnson Matthey Inc.) and QMI 2412 ( a die attach adhesive marketed by Quantum Materials, Inc.) treated in the same manner. The results are presented in Table V

TABLE V

Summary of Adhesive Tests

| Sample | Peak Firing Temp. (°C.) | Results |
|---|---|---|
| Invention | 350 | 97 lbs - cohesive failure die broke |
| | 375 | 108 lbs - cohesive failure die broke |
| JM 4720 | 350 | 1 lb - adhesive failure |
| | 375 | 9 lbs - adhesive failure |
| QMI 2412 | 350 | 2 lbs - adhesive failure |
| | 375 | 8 lbs - adhesive failure |

As shown, it can be seen that only the adhesive of this invention formed a strong bond under these conditions.

Example 6 Thermal Expansion Coefficients of the Glasses

To assess the utility of these glasses in sealing glass applications, thermal expansion coefficients over the 25°–150° C. range were measured for several representative glasses of this invention on a thermo-mechanical analyzer (TMA). The results are reported as parts per million expansion per ° C. (ppm/° C.) over this temperature range, and are summarized in Table VI.

TABLE VI

Summary of Thermal Expansion Results

| Glass Sample | Thermal Expansion Coefficient (ppm °C.) |
|---|---|
| 9 | 16.7 |
| 10 | 16.8 |
| 14 | 14.7 |
| 19 | 17.1 |
| 22 | 19.2 |

The results demonstrate that the glasses have thermal expansion coefficiently of approximately 14–20 ppm/° C. in the operative temperature range.

To further assess the utility of these glasses as sealing glasses blends of glass 14 with ceramic fillers were examined on the TMA. The results are presented in Table VII.

TABLE VII
Summary of Thermal Expansion Results with Fillers

| Glass Sample | Filler Type | Wt. % Filler | Thermal Expansion Coefficient (ppm/°C.) |
|---|---|---|---|
| 14 | beta-eucryptite | 25 | 7.5 |
| 14 | beta-eucryptite | 33 | 5.5 |
| 14 | amorphous silica | 33 | 6.9 |

These results demonstrate that the thermal expansion coefficient can be greatly reduced by use of a ceramic filler.

It is apparent that many modifications and variations of this invention as hereinabove set forth may be made without departing from the spirit and scope thereof. The specific embodiments are given by way of example only and the invention is limited only by the terms of the appended claims.

What is claimed is:

1. A low softening point glass composition comprising 2 to 40% by wt. silver oxide, 12 to 40% by wt. vanadium oxide, and 35 to 75% by wt. tellurium oxide, and 2 to 30% by wt. lead oxide, wherein all percentages total 100.

2. The low softening point glass composition of claim 1, wherein the ratio of silver oxide/tellurium oxide is 0.1/1 to 0.5/1 (wt./wt.).

3. The low softening point glass composition of claim 1 having a glass transition temperature below 260° C.

4. The low softening point glass composition of claim 1, which further comprises up to a total of 10% (by wt.) of one or more oxide compounds selected from the group consisting of phosphorous oxide, tungsten oxide, silicon oxide, copper oxide, aluminum oxide, bismuth oxide, tin oxide, zinc oxide thallium oxide, arsenic oxide, molybdenum oxide, titanium oxide, and antimony oxide.

5. A die attach adhesive composition consisting essentially of an admixture of
   (a) a metal selected from the group consisting of silver, gold, and plantinum, and
   (b) a powdered, low softening point glass composition comprising 2 to 40% by wt. silver oxide, 12 to 40% by wt. vanadium oxide, 35 to 75% by wt. tellurium oxide, and 2 to 30% by wt. lead oxide, wherein all percentages total 100,
having a peak firing temperature of 400° C. or lower, wherein the ratio of (a)/(b) is 4:1 to 100:1.

6. The die attach adhesive of claim 5 wherein the metal is silver.

7. The die attach adhesive of claim 5, wherein the metal is selected from the group consisting of flaked metal, powdered metal, mixtures of flaked metals, mixtures of powdered metals, and mixtures of flaked and powdered metals.

8. The die attach adhesive of claim 6, wherein the ratio of silver oxide/tellurium oxide in the glass composition is 0.1/1 to 0.5/1 (wt./wt.).

9. The die attach adhesive of claim 5, wherein the glass composition has a glass transition temperature below 260° C.

10. The die attach adhesive of claim 5, wherein the glass composition further comprises up to a total of 10% (by wt.) of one or more oxide compounds selected from the group consisting of phosphorous pentoxide, tungsten oxide, silicon oxide, copper oxide, aluminum oxide, bismuth oxide, tin oxide, zinc oxide thallium oxide, arsenic oxide, molybdenum oxide, titanium oxide, and antimony oxide.

11. A sealing glass comprising the low softening point composition of claim 1.

12. The sealing glass of claim 11 which further comprises an effective amount of an expansion-modifying filler, such that the thermal expansion coefficient of the glass is reduced.

13. The sealing glass of claim 12, wherein the expansion-modifying filler is selected from the group consisting of beta-eucryptite and amorphous silica.

* * * * *